(12) United States Patent
Chang et al.

(10) Patent No.: US 11,170,861 B1
(45) Date of Patent: Nov. 9, 2021

(54) NON-VOLATILE MEMORY WITH MULTI-LEVEL CELL ARRAY AND ASSOCIATED PROGRAM CONTROL METHOD

(71) Applicant: eMemory Technology Inc., Hsin-Chu (TW)

(72) Inventors: Chia-Fu Chang, Hsinchu County (TW); Hung-Yi Liao, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/939,573

(22) Filed: Jul. 27, 2020

(30) Foreign Application Priority Data

May 11, 2020 (TW) ................. 109115644

(51) Int. Cl.
| | |
|---|---|
| *G11C 16/34* | (2006.01) |
| *G11C 16/10* | (2006.01) |
| *G11C 16/04* | (2006.01) |
| *G11C 16/30* | (2006.01) |
| *G11C 16/08* | (2006.01) |

(52) U.S. Cl.
CPC ...... *G11C 16/3481* (2013.01); *G11C 16/0433* (2013.01); *G11C 16/08* (2013.01); *G11C 16/10* (2013.01); *G11C 16/30* (2013.01)

(58) Field of Classification Search
CPC .................................................... G11C 16/10
See application file for complete search history.

(56) References Cited

U.S. PATENT DOCUMENTS

| | | | |
|---|---|---|---|
| 7,110,297 | B2 | 9/2006 | Morikawa et al. |
| 2007/0025147 | A1* | 2/2007 | Mori ............... G11C 11/5671 365/185.2 |
| 2008/0158935 | A1 | 7/2008 | Taguchi |
| 2009/0251969 | A1 | 10/2009 | Roohparvar et al. |
| 2014/0269031 | A1 | 9/2014 | Jung et al. |

OTHER PUBLICATIONS

Search report issued by EPO dated Mar. 25, 2021.
Wang Kang et al., Variation-Tolerant and Disturbance-Free Sensing Circuit for Deep Nanometer STT-MRAM_20141106, Nov. 2014, pp. 1088-1092, vol. 13, No. 6, IEEE Transactions on Nanotechnology.

* cited by examiner

*Primary Examiner* — Douglas King
(74) *Attorney, Agent, or Firm* — WPAT, PC

(57) ABSTRACT

A non-volatile memory includes a cell array, a current supply circuit, a path selecting circuit and a verification circuit. The cell array includes plural multi-level memory cells in an m×n array. The cell array is connected with m word lines and n lines. Each of the plural multi-level memory cells is in one of X storage states. The current supply circuit provides plural reference currents. The path selecting circuit is connected with the current supply circuit and the n bit lines. The verification circuit is connected with the path selecting circuit, and generates n verification signals. A first path selector of the path selecting circuit is connected with a path selecting circuit and a first bit line. A first verification device of the verification circuit is connected with the first path selector and generates a first verification signal.

13 Claims, 10 Drawing Sheets

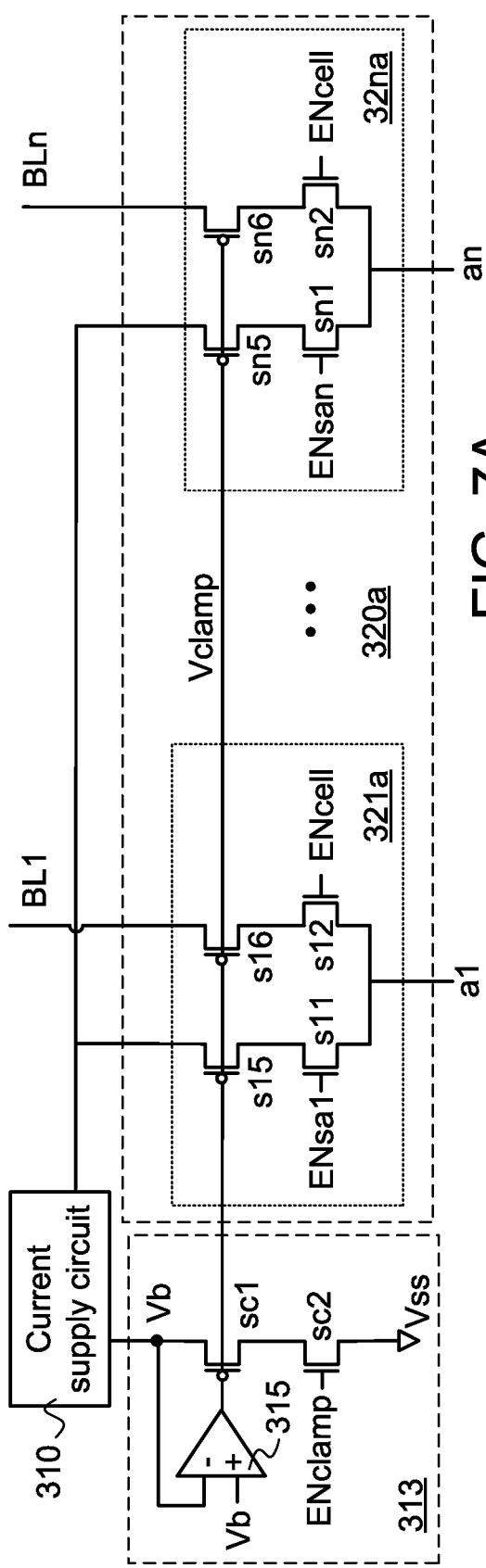
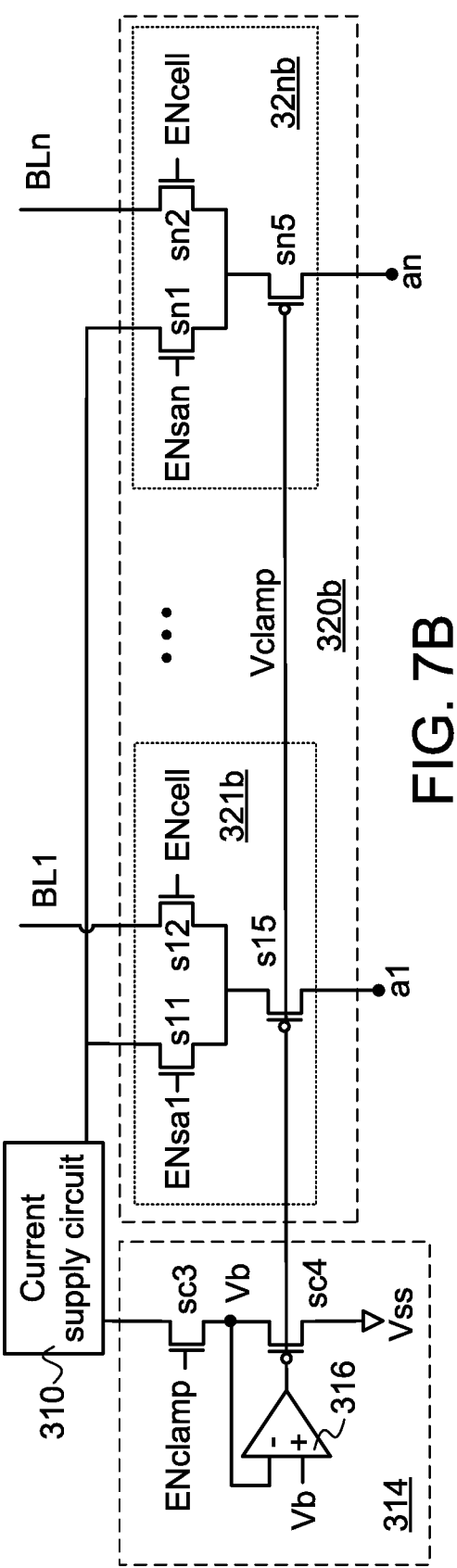
FIG. 7A
FIG. 7B

NON-VOLATILE MEMORY WITH MULTI-LEVEL CELL ARRAY AND ASSOCIATED PROGRAM CONTROL METHOD

This application claims the benefit of Taiwan application Serial No. 109115644, filed May 11, 2020, the subject matters of which are incorporated herein by reference.

FIELD OF THE INVENTION

The present invention relates to a non-volatile memory and an associated control method, and more particularly to a non-volatile memory with a multi-level cell array and an associated program control method.

BACKGROUND OF THE INVENTION

As is well known, a non-volatile memory is able to continuously retain data after the supplied power is interrupted. Consequently, the non-volatile memory is widely applied to a variety of electronic devices. Generally, the non-volatile memories are classified into a one-time programmable non-volatile memory (also referred as an OTP non-volatile memory) and a multi-time programmable non-volatile memory (also referred as an MTP non-volatile memory). The memory cells of the OTP non-volatile memory are OTP memory cells. The memory cells of the MTP non-volatile memory are MTP memory cells. Hereinafter, the circuitry structures of some types of non-volatile memory cells will be illustrated with reference to FIGS. 1A~1E.

FIG. 1A is a schematic circuit diagram illustrating an OTP non-volatile memory cell. As shown in FIG. 1A, the OTP non-volatile memory cell c1 comprises a floating gate transistor F and a switching transistor M. The first terminal of the OTP non-volatile memory cell c1 is connected with a source line SL. The second terminal of the OTP non-volatile memory cell c1 is connected with a bit line BL. The control terminal of the OTP non-volatile memory cell c1 is connected with a word line WL.

Please refer to FIG. 1A again. The first source/drain terminal of the switching transistor M is connected with the source line SL. The gate terminal of the switching transistor M is connected with the word line WL. The first source/drain terminal of the floating gate transistor F is connected with the second source/drain terminal of the switching transistor M. The second source/drain terminal of the floating gate transistor F is connected with the bit line BL.

For writing the OTP non-volatile memory cell c1, proper bias voltages are provided to the OTP non-volatile memory cell c1. Consequently, the OTP non-volatile memory cell c1 undergoes a program action, or the OTP non-volatile memory cell c1 undergoes a program inhibition action. During the program action of the OTP non-volatile memory cell c1, hot carriers are injected into the floating gate of the floating gate transistor F. During the program inhibition action, hot carriers are not injected into the floating gate of the floating gate transistor F. Moreover, the hot carriers are electrons.

For example, when the write action is performed on the OTP non-volatile memory cell c1, a program voltage is provided to the source line SL, an on voltage is provided to the word line WL, and a ground voltage is provided to the bit line BL. Consequently, the hot carriers are injected into the floating gate through a channel region of the floating gate transistor F. Whereas, when the program inhibition action is performed on the OTP non-volatile memory cell c1, the program voltage is provided to the source line SL, the on voltage is provided to the word line WL, and the bit line BL is in a floating state. Consequently, the hot carriers cannot be injected into the floating gate of the floating gate transistor F. In some situations, the bit line BL is not in the floating state. When the program inhibition action is performed on the OTP non-volatile memory cell c1, the program voltage is provided to the bit line BL. Consequently, the hot carriers cannot be injected into the floating gate of the floating gate transistor F.

In case that no hot carriers are stored in the floating gate of the floating gate transistor F, the OTP non-volatile memory cell c1 is in a first storage state (i.e., an off state). Whereas, in case that the hot carriers are stored in the floating gate of the floating gate transistor F, the OTP non-volatile memory cell c1 is in a second storage state (i.e., an on state). In other words, the OTP non-volatile memory cell c1 is in the first storage state after the program inhibition action is performed on the OTP non-volatile memory cell c1, and the OTP non-volatile memory cell c1 is in the second storage state after the program action is performed on the OTP non-volatile memory cell c1.

For performing a read action, proper bias voltages are provided to the OTP non-volatile memory cell c1. Consequently, the OTP non-volatile memory cell c1 generates a cell current. According to the magnitude of the cell current, the storage state of the OTP non-volatile memory cell c1 can be judged. For example, when the read action is performed, a read voltage is provided to the source line SL, the on voltage is provided to the word line WL, and the ground voltage is provided to the bit line BL. In case that the OTP non-volatile memory cell c1 is in the first storage state (i.e., the off state), the cell current is nearly zero. In case that the OTP non-volatile memory cell c1 is in the second storage state (i.e., the on state), the cell current is higher. The bit line BL of the OTP non-volatile memory cell c1 is connected with a sensing circuit (not shown). According to the magnitude of the cell current, the sensing circuit judges whether the OTP non-volatile memory cell c1 is in the first storage state (i.e., the off state) or the second storage state (i.e., the on state).

Generally, the magnitude of the program voltage is high. In order to prevent from damage of the switching transistor M during the write cycle, the OTP non-volatile memory cell may be further equipped with a following transistor. FIG. 1B is a schematic circuit diagram illustrating another OTP non-volatile memory cell. As shown in FIG. 1B, the OTP non-volatile memory cell c2 comprises a floating gate transistor F, a following transistor Mg and a switching transistor M. The first terminal of the OTP non-volatile memory cell c2 is connected with a source line SL. The second terminal of the OTP non-volatile memory cell c2 is connected with a bit line BL. The first control terminal of the OTP non-volatile memory cell c2 is connected with a word line WL. The second control terminal of the OTP non-volatile memory cell c2 is connected with a following line FL.

Please refer to FIG. 1B again. The first source/drain terminal of the switching transistor M is connected with the source line SL. The gate terminal of the switching transistor M is connected with the word line WL. The first source/drain terminal of the following transistor Mg is connected with the second source/drain terminal of the switching transistor M. The gate terminal of the following transistor Mg is connected with the following line FL. The first source/drain terminal of the floating gate transistor F is connected with the second source/drain terminal of the following line FL.

The second source/drain terminal of the floating gate transistor F is connected with the bit line BL. Generally, the operation of the switching transistor M and the operation of the following transistor Mg are similar. When the switching transistor M is turned on, the following transistor Mg is turned on. When the switching transistor M is turned off, the following transistor Mg is turned off. The bias voltages and the operating principles of the OTP non-volatile memory cell c2 for performing the write action and the read action are similar to those of the OTP non-volatile memory cell c1, and are not redundantly described herein.

FIG. 10 is a schematic circuit diagram illustrating an MTP non-volatile memory cell. In comparison with the OTP non-volatile memory cell c1 of FIG. 1A, the MTP non-volatile memory cell c3 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c3 are similar to those of the OTP non-volatile memory cell c1. The detailed operations are redundantly described herein.

For performing an erase action, an erase voltage is provided to the erase line EL. Consequently, the hot carriers are moved from the erase capacitor C to the erase line EL and ejected from the floating gate.

FIG. 1D is a schematic circuit diagram illustrating another MTP non-volatile memory cell. In comparison with the OTP non-volatile memory cell c2 of FIG. 1B, the MTP non-volatile memory cell c4 further comprises an erase capacitor C. The erase capacitor C is connected between the floating gate of the floating gate transistor F and an erase line EL. When the write action and the read action are performed, a ground voltage is provided to the erase line EL, and the other bias voltages provided to the MTP non-volatile memory cell c4 are similar to those of the OTP non-volatile memory cell c2. The detailed operations are not redundantly described herein.

Similarly, for performing an erase action, an erase voltage is provided to the erase line EL. Consequently, the hot carriers are moved from the erase capacitor C to the erase line EL and ejected from the floating gate.

In the non-volatile memory cells as shown in FIGS. 1A to 1D, the transistors are P-type transistors. Alternatively, the transistors of the OTP non-volatile memory cells and the MTP non-volatile memory cells are N-type transistors.

FIG. 1E is a schematic circuit diagram illustrating another MTP non-volatile memory cell. As shown in FIG. 1E, the MTP non-volatile memory cell c5 comprises a switching transistor M and a resistor R. The first terminal of the MTP non-volatile memory cell c5 is connected with a source line SL. The second terminal of the MTP non-volatile memory cell c5 is connected with a bit line BL. The control terminal of the MTP non-volatile memory cell c5 is connected with a word line WL.

The first source/drain terminal of the switching transistor M is connected with the source line SL. The gate terminal of the switching transistor M is connected with the word line WL. The second source/drain terminal of the switching transistor M is connected with the first terminal of the resistor R. The second terminal of the resistor R is connected with the bit line BL. The resistor R is made of transition metal oxide (TMO).

Generally, the storage state of the resistor R can be determined according to the voltage difference between the first terminal and the second terminal of the resistor R. For example, if the voltage difference between the first terminal and the second terminal of the resistor R has a first polarity (e.g., the negative polarity), the resistor R is in a first storage state corresponding to the high resistance. Whereas, if the voltage difference between the first terminal and the second terminal of the resistor R has a second polarity (e.g., the positive polarity), the resistor R is in a first storage state corresponding to the low resistance. In other words, when the write action is performed, proper bias voltages are provided to the MTP non-volatile memory cell c5. Consequently, the storage state of the MTP non-volatile memory cell c5 is controllable.

FIG. 2 is a schematic circuit diagram illustrating a cell array of a non-volatile memory. As shown in FIG. 2, the cell array 200 comprises a plural memory cells c11~cmn, which are arranged in an m×n array. Each of the memory cells c11~cmn has the structure of the OTP non-volatile memory cell c1. It is noted that the structure of the memory cell is not restricted. That is, the memory cells c2~c5 may be constituted as other cell arrays.

The memory cells c11~cmn comprise switching transistors $M_{1,1}$~$M_{m,n}$ and floating gate transistors $F_{1,1}$~$F_{m,n}$, respectively. Each of the memory cells c11~cmn has the structure of the OTP non-volatile memory cell c1. The detailed structure of the memory cell is not redundantly described herein. The first terminals of the memory cells c11~cmn are connected with a source line SL, wherein m and n are positive.

The control terminals of then memory cells c11~c1$n$ in the first row are connected with a word line WL1. The second terminals of the n memory cells c11~c1$n$ in the first row are connected with the corresponding bit lines BL1~BLn, respectively. The control terminals of the n memory cells c21~c2$n$ in the second row are connected with a word line WL2. The second terminals of the n memory cells c21~c2$n$ in the second row are connected with the corresponding bit lines BL1~BLn, respectively. The rest may be deduced by analog.

Generally, during the write action or the read action of the non-volatile memory, only one of the m word lines WL1~WLm of the cell array 200 is activated and the other word lines are inactivated. For example, if the word line WL1 is activated during the write action, the first row is the selected row. Since various bias voltages are provided to the bit lines BL1~BLn, the program action or the program inhibition action is performed on the corresponding memory cells of the selected row. When the program inhibition action is performed on the memory cell, the hot carriers cannot be injected into the floating gate of the floating gate transistor. Consequently, the memory cell is in the first storage state. When the program action is performed on the memory cell, the hot carriers are injected into the floating gate of the floating gate transistor. Consequently, the memory cell is in the second storage state. For example, if a ground voltage is provided to the bit line BL1, the memory cell c11 is in the second storage state. Whereas, if the bit line BL2 is in the floating state, the memory cell c12 is in the first storage state.

The memory cells of the conventional cell array are single-level memory cells. That is, one memory cell is able to store a 1-bit data. The data indicates the first storage state or the second storage state. When the write action is performed, the memory cell is selectively in the first storage state or the second storage state according to the result of injecting the hot carriers into the floating gate or not injecting the hot carriers into the floating gate.

In some situations, the memory cells are multi-level memory cells. That is, one memory cell stores the data with at least two bits. For example, if the multi-level memory cell is able to store a 2-bit data, the data of the memory cell indicates one of a first storage state, a second storage state, a third storage state and a fourth storage state. Similarly, if the multi-level memory cell is able to store a 3-bit data, the multi-level memory cell has eight ($=2^3$) storage states. Similarly, if the multi-level memory cell is able to store a 4-bit data, the multi-level memory cell has sixteen ($=2^4$) storage states.

For allowing the multi-level memory cell to have different storage states, it is necessary to control the amount of hot carriers injected into the floating gate during the write action. However, due to the process variation of the memory cells and the load differences on the bit lines BL1~BLn, some drawbacks occur. For example, even if two memory cells have the same amount of injected hot carriers, the storage states of the two memory cells may be different.

SUMMARY OF THE INVENTION

An embodiment of the present invention provides a non-volatile memory. The non-volatile memory includes a cell array, a current supply circuit, a path selecting circuit and a verification circuit. The cell array includes plural multi-level memory cells in an m×n array. The cell array is connected with m word lines and n lines. Each of the plural multi-level memory cells is in one of X storage states. X is larger than or equal to 4. The current supply circuit provides X reference currents. The path selecting circuit is connected with the current supply circuit and the n bit lines. The path selecting circuit includes n path selectors. A first path selector of the n path selectors is connected with the current supply circuit and the first bit line. The verification circuit is connected with the path selecting circuit, and generates n verification signals. The verification circuit includes n verification devices. A first verification device of the n verification devices is connected with the first path selector and generates a first verification signal. While a verification action is performed, an M-th reference current from the current supply circuit is transmitted to the first verification device through the first path selector and converted into a first reference voltage, and then a first cell current generated by the first multi-level memory cell of the plural multi-level memory cells is transmitted to the first verification device through the first bit line and the first path selector and converted into a first sensed voltage. According to the first reference voltage and the first sensed voltage, the first verification device generates the first verification signal to indicate whether the first multi-level memory cell has reached an M-th storage state of the X storage states. Moreover, m, n, M and X are positive integers, M is larger than 1, and M is smaller than or equal to X.

Another embodiment of the present invention provides a program control method for the non-volatile memory. Firstly, a selected row of the cell array is determined, and a program cycle of the selected row is started. Then, M is set as 1. In a step (a), the current supply circuit provides the M-th reference current. In a step (b), a write action is performed to program the memory cells which have not reached the M-th storage state. In a step (c), the verification action is performed to judge whether the programmed memory cells have reached the M-th storage state. If the programmed memory cells have not reached the M-th storage state, the step (b) is performed again. If the programmed memory cells have reached the M-th storage state, it is judged whether M is equal to X. If M is not equal to X, 1 is added to M, and the step (a) is performed again. If M is equal to X, the program cycle is ended.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 7A and 7B are schematic circuit diagrams illustrating two examples of a path selecting circuit with a voltage clamping circuit.

DETAILED DESCRIPTION OF PREFERRED EMBODIMENTS

The present invention provides a non-volatile memory with a multi-level cell array. The multi-level cell array is a cell array with plural memory cells. The memory cells of the multi-level cell array have the structures of the memory cells as shown in FIGS. 1A to 1E. Since the memory cells of the multi-level cell array are multi-level memory cells, each memory cell has at least four storage states. In different storage states, the magnitudes of the cell currents generated by the memory cells are different.

Figure 1A:
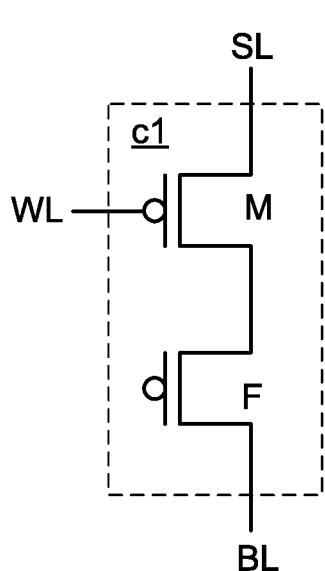
FIGS. 1A~1E (prior art) are schematic circuit diagrams illustrating some types of non-volatile memory cells.
Figure 1B:
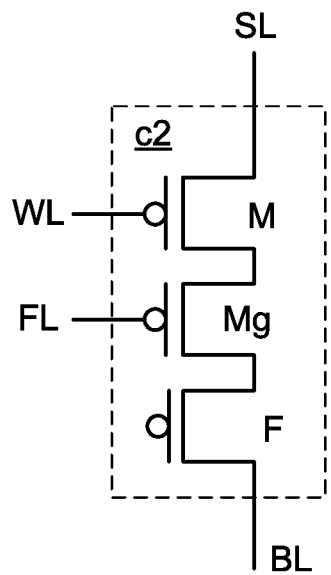
Figure 1C:
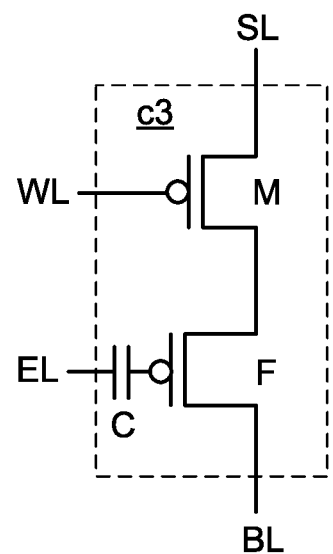
Figure 1D:
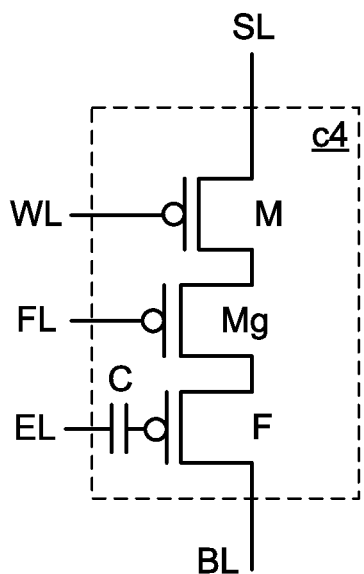
Figure 1E:
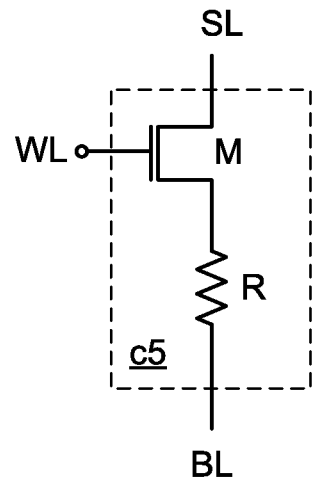

Take the memory cell c1 as shown in FIG. 1A for example. According to the amount of hot carriers injected into the floating gate from low to high, the memory cell c1 has the storage states from a first storage state to an X-th storage state, wherein X is larger than or equal to 4. For example, if the multi-level memory cell c1 is able to store the 2-bit data, X=4. That is, the memory cell c1 is in one of a first storage state, a second storage state, a third storage state and a fourth storage state. Whereas, if the multi-level memory cell c1 is able to store the 3-bit data, X=8. That is, the memory cell c1 is in one of the storage states from the first storage state to the eighth storage state. Whereas, if the multi-level memory cell c1 is able to store the 4-bit data, X=16. That is, the memory cell c1 is in one of the storage states from the first storage state to the sixteenth storage state.

For example, if the multi-level memory cell c1 is able to store the 2-bit data, the magnitudes of the generated cell currents corresponding to the four storage states are different during the read action. For example, the generated cell current corresponding to the first storage state is 0.1 µA, the generated cell current corresponding to the second storage state is 0.6 µA, the generated cell current corresponding to the third storage state is 1.1 µA, and the generated cell current corresponding to the fourth storage state is 1.6 µA.

In an embodiment, plural write actions and plural verification actions are performed during the program cycle. Moreover, the time period of performing each write action is very short (e.g., 100 ns). Consequently, few hot carriers are injected into the floating gate of the memory cell. After the write action is completed, the verification action is immediately performed to judge whether the magnitude of the cell current generated by the memory cell complies with a predetermined storage state. If the magnitude of the cell current generated by the memory cell does not comply with the predetermined storage state, the write action is continuously performed to inject few hot carriers into the floating gate of the memory cell again. The write action and the verification action are continuously performed until the magnitude of the cell current generated by the memory cell complies with a predetermined storage state.

Hereinafter, the multi-level memory cell capable of storing 2-bit data will be taken as an example to describe the concepts of the present invention. It is noted that the technology of the present invention can be applied to the multi-level memory cell capable of storing the data with more than two bits.

Figure 2:
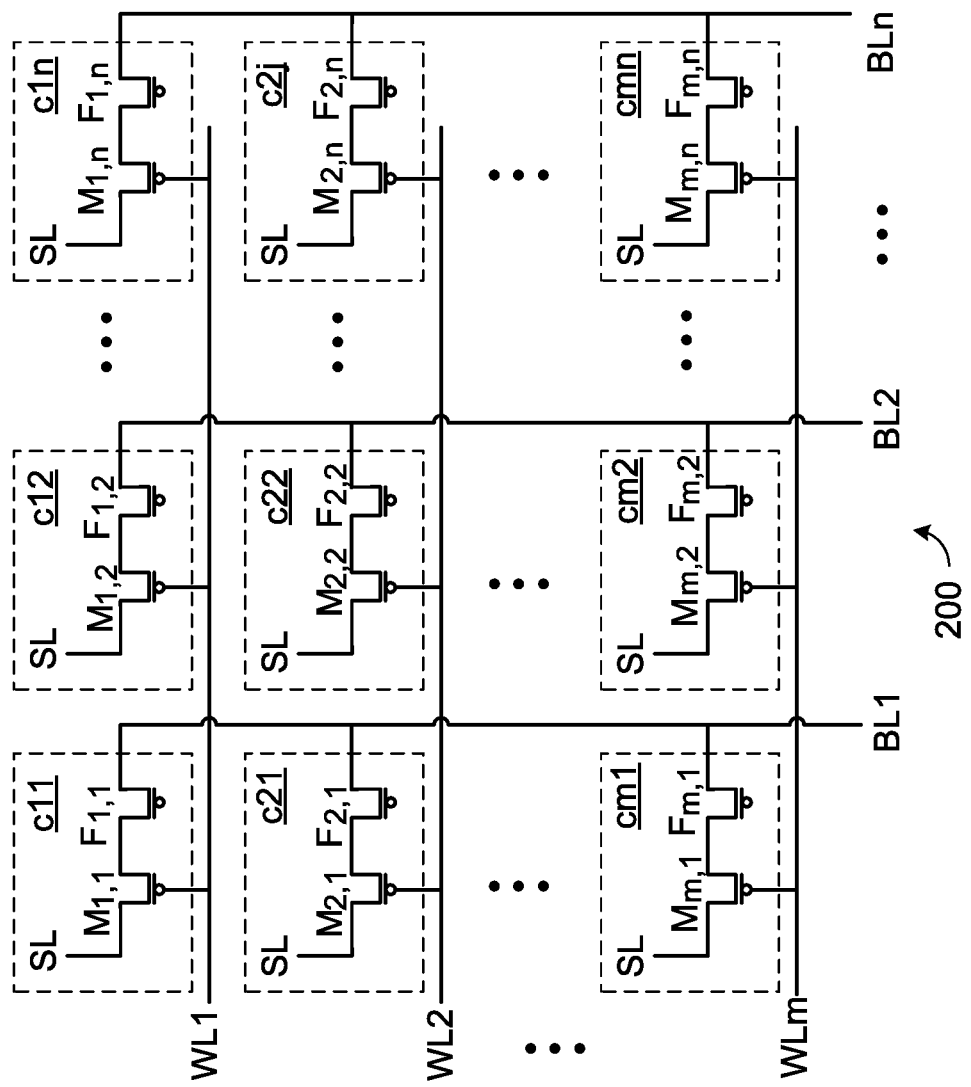
FIG. 2 (prior art) is a schematic circuit diagram illustrating a cell array of a non-volatile memory.
Figure 3:
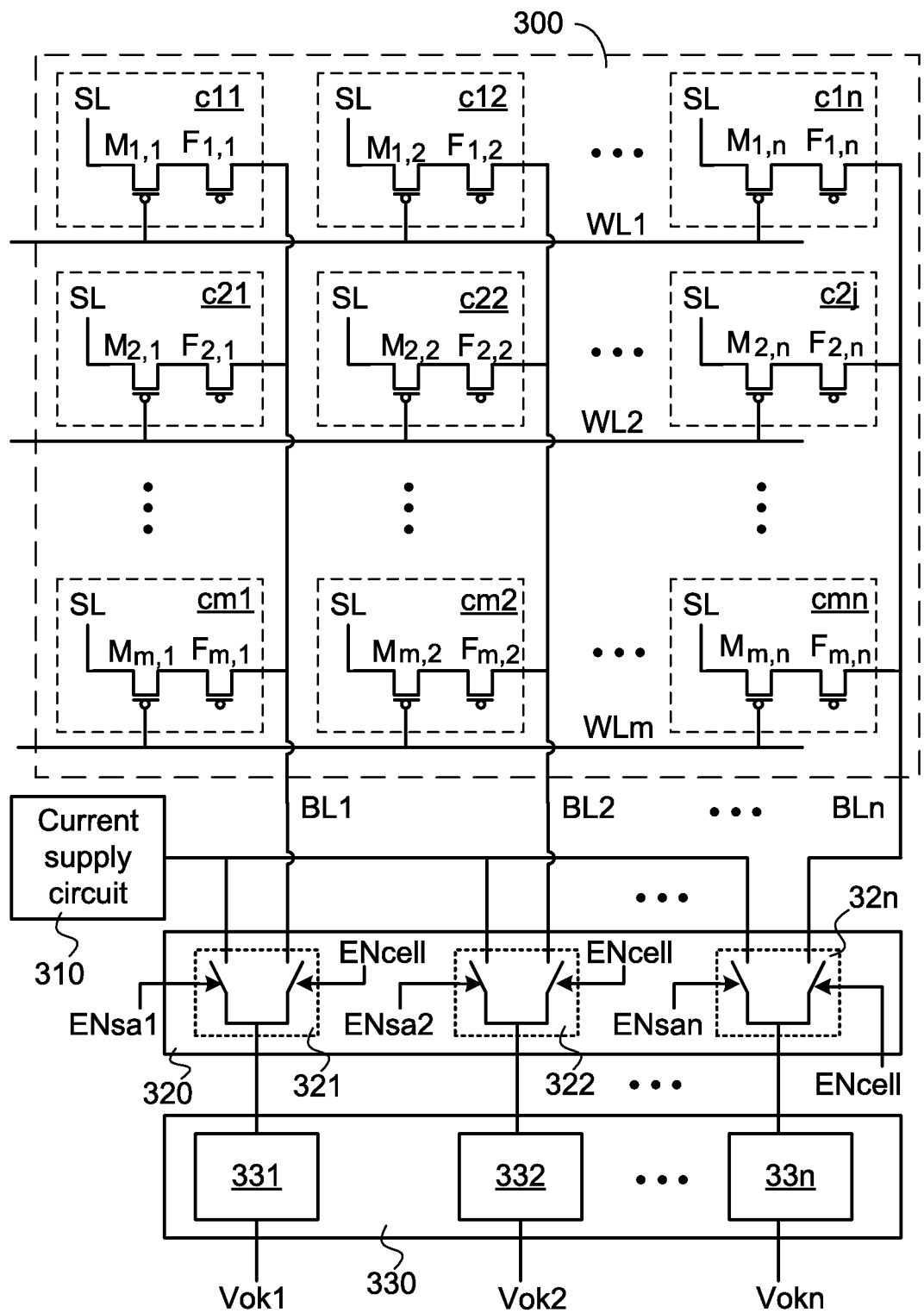
FIG. 3 is a schematic circuit diagram illustrating a non-volatile memory according to the embodiment of the present invention.

FIG. 3 is a schematic circuit diagram illustrating a non-volatile memory according to the embodiment of the present invention. As shown in FIG. 3, the non-volatile memory comprises a cell array 300, a current supply circuit 310, a path selecting circuit 320 and a verification circuit 330. The cell array 300 comprises plural memory cells in an m×n array. The circuitry structure of the cell array 300 is similar to the circuitry structure of the cell array as shown in FIG. 2, and not redundantly described herein. The memory cells of the cell array 300 are OTP memory cells or MTP memory cells.

The current supply circuit 310 comprises plural current sources to provide X reference currents. For example, in case that the multi-level memory cell is able to store the 2-bit data, the generated cell current corresponding to the first storage state is 0.1 µA, the generated cell current corresponding to the second storage state is 0.6 µA, the generated cell current corresponding to the third storage state is 1.1 µA, and the generated cell current corresponding to the fourth storage state is 1.6 µA. Under this circumstance, the current supply circuit 310 provides four reference currents (i.e., X=4) corresponding to the four storage states. That is, the first reference current is 0.1 µA, the second reference current is 0.6 µA, the third reference current is 1.1 µA, and the fourth reference current is 1.6 µA.

Similarly, in case that the multi-level memory cell is able to store the 3-bit data, the current supply circuit 310 provides eight reference currents. Similarly, in case that the multi-level memory cell is able to store the 4-bit data, the current supply circuit 310 provides sixteen reference currents.

The path selecting circuit 320 comprises n path selectors 321~32n. The verification circuit 330 comprises n verification devices 331~33n. The structures of the path selectors 321~32n are identical. The structures of the verification devices 331~33n are identical.

The operations of the path selector 321 and the verification device 331 will be described as follows. The path selector 321 comprises a reference current path and a cell current path. The reference current path is connected with the current supply circuit 310. The cell current path is connected with the bit line BL1. The reference current path is controlled according to a reference current enable signal ENsa1. The cell current path is controlled according to a cell current enable signal ENcell. When the reference current enable signal ENsa1 is activated, the current supply circuit 310 is connected with the verification device 331 through the reference current path of the path selector 321. When the cell current enable signal ENcell is activated, the bit line BL1 is connected with the verification device 331 through the cell current path of the path selector 321.

When a verification action is performed, the verification device 331 receives the reference current from the current supply circuit 310 and converts the reference current into a reference voltage. Then, the verification device 331 receives the cell current from the bit line BL1 and converts the cell current into a sensed voltage. Then, the verification device 331 generates a verification signal Vok1 according to the reference voltage and the sensed voltage. The verification signal Vok1 indicates whether the magnitude of the cell current of the bit line BL1 complies with the predetermined storage state.

Figure 4A:
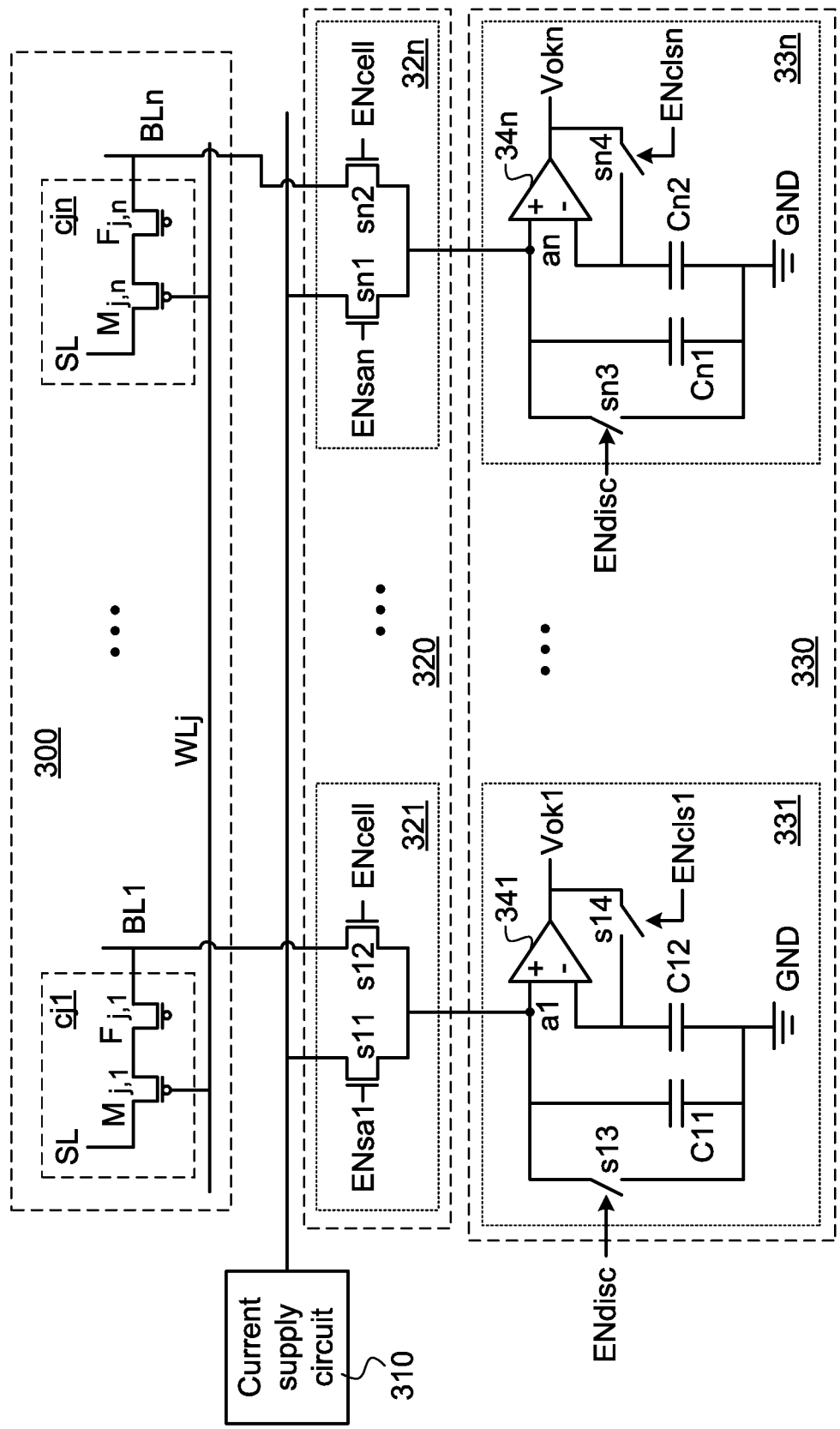
FIG. 4A is a schematic circuit diagram illustrating the detailed structures of the path selecting circuit and the verification circuit of the non-volatile memory as shown in FIG. 3.
Figure 4B:
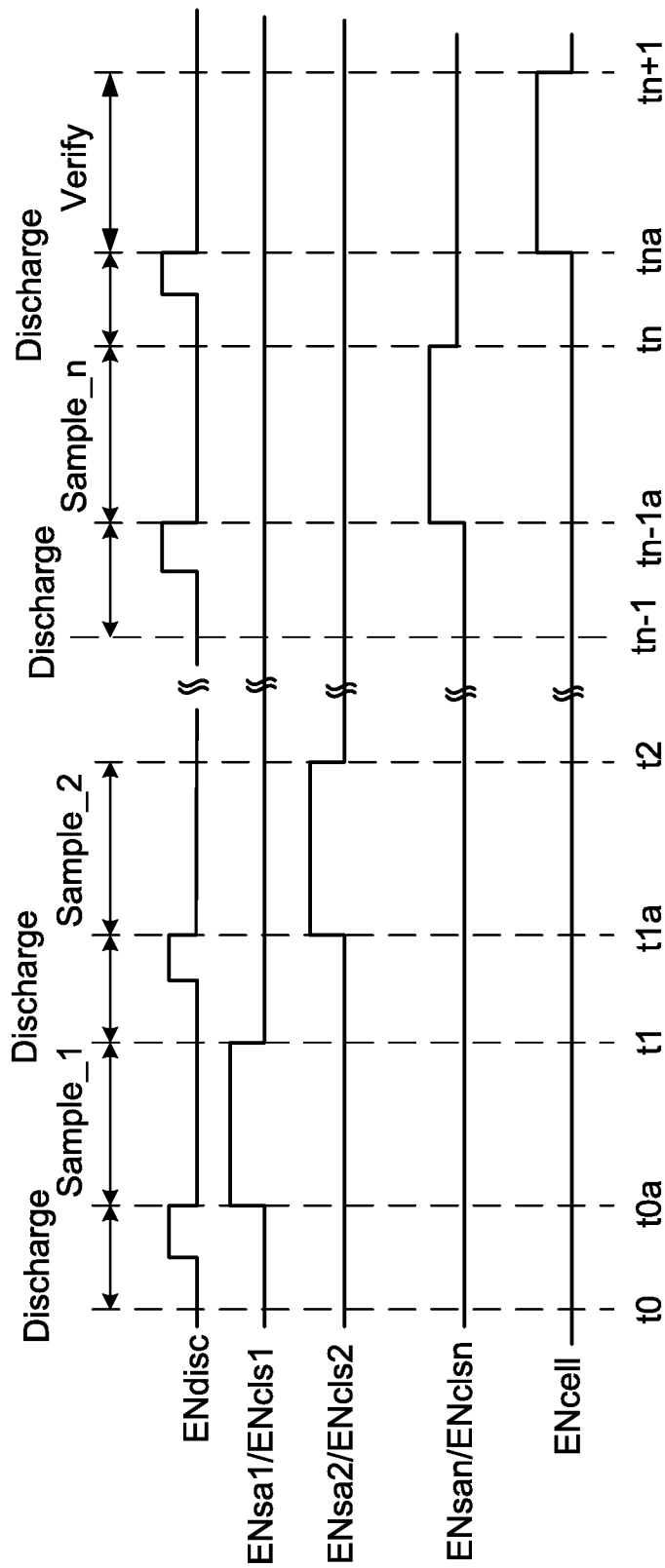
FIG. 4B is a schematic timing waveform diagram illustrating associated signals of the path selecting circuit and the verification circuit.

Please refer to FIGS. 4A and 4B. FIG. 4A is a schematic circuit diagram illustrating the detailed structures of the path selecting circuit and the verification circuit of the non-volatile memory as shown in FIG. 3. FIG. 4B is a schematic timing waveform diagram illustrating associated signals of the path selecting circuit and the verification circuit. For succinctness, only n memory cells cj1~cjn in the j-th row of the cell array 300 are shown in FIG. 4A. These memory cells are connected with the word line WLj.

The path selecting circuit 320 comprises n path selectors 321~32n. The verification circuit 330 comprises n verification devices 331~33n. The structures of the path selectors 321~32n are identical. The structures of the verification devices 331~33n are identical. The operations of the path selector 321 and the verification device 331 will be described as follows.

The reference current path of the path selector 321 comprises a switching transistor s11. The first source/drain terminal of the switching transistor s11 is connected with the current supply circuit 310. The second source/drain terminal of the switching transistor s11 is connected with the node a1. The gate terminal of the switching transistor s11 receives the reference current enable signal ENsa1. The cell current path of the path selector 321 comprises a switching transistor s12. The first source/drain terminal of the switching transistor s12 is connected with the bit line BL1. The second source/drain terminal of the switching transistor s12 is connected with the node a1. The gate terminal of the switching transistor s12 receives the current enable signal ENcell.

The verification device 331 comprises an operation amplifier 341, a switch s13, a switch s14, a capacitor C11 and a capacitor C12. The first terminal of the switch s13 is connected with the node a1. The second terminal of the switch s13 is connected with a ground terminal GND. The control terminal of the switch s13 receives a discharge enable signal ENdisc. The first terminal of the capacitor C11 is connected with the node a1. The second terminal of the capacitor C11 is connected with the ground terminal GND. The first terminal of the capacitor C12 is connected with a negative input terminal of the operation amplifier 341. The second terminal of the capacitor C12 is connected with the ground terminal GND. A positive input terminal of the operation amplifier 341 is connected with the node a1. An output terminal of the operation amplifier 341 generates the verification signal Vok1. The first terminal of the switch s14 is connected with the output terminal of the operation amplifier 341. The second terminal of the switch s14 is connected with the negative input terminal of the operation amplifier 341. The control terminal of the switch s14 receives a close-loop enable signal ENcls1. For example, the switches s13 and s14 are transistors.

Please refer to FIG. 4A. When the word line WLj is activated, the write action is performed on the memory cells cj1~cjn of the selected row. After the write action is completed, the verification action is performed. Consequently, the path selecting circuit 320 and the verification circuit 330 judge whether the memory cells cj1~cjn of the selected memory row are in the predetermined storage states.

As shown in FIG. 4B, the verification action contains n reference current sampling phases and a cell current sampling phase. In the n reference current sampling phases, the reference current enable signals ENsa1~ENsan and the close-loop enable signal ENcls1~ENclsn are activated.

Please refer to FIG. 4B. In the first reference current sampling phase between the time point t0 and the time point t1, the path selector 321 and the verification device 331 are enabled. In the second reference current sampling phase between the time point t1 and the time point t2, the path selector 322 and the verification device 332 are enabled. The rest may be deduced by analog. In the n-th reference current sampling phase between the time point tn−1 and the time point tn, the path selector 32n and the verification device 33n are enabled. In the cell current sampling phase between the time point tn and the time point tn+1, the n path selectors 321~32n and the n verification devices 331~33n are enabled.

Each reference current sampling phase contains a discharge period and a sample period. For example, in the first reference current sampling phase, the time period between the time point t0 and the time point t0a is the discharge period and the time period between the time point t0a and the time point t1 is the sample period Sample_1.

In an embodiment, the time durations of the sample periods Sample_1~Sample_n in the reference current sampling phases and the time duration of the verification period Verify in the cell current sampling phase are equal. It is noted that the time durations of the sample periods and the time duration of the verification period may be varied according to the practical requirements.

FIGS. 5A~5D are schematic circuit diagrams illustrating the operations of the path selector 321 and the verification device 331 during the verification action.

Figure 5A:
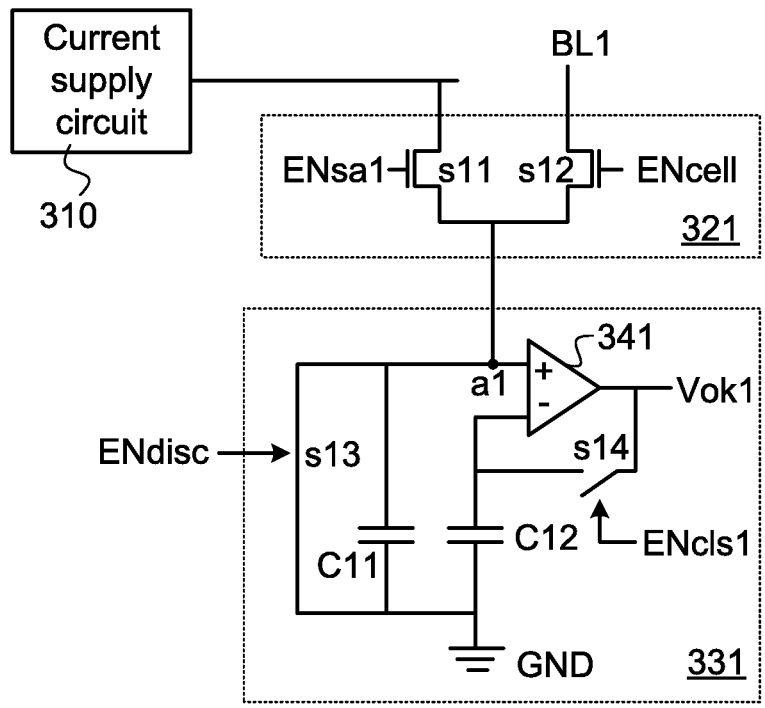
FIGS. 5A~5D are schematic circuit diagrams illustrating the operations of a path selector of the path selecting circuit and a verification device of the verification circuit as shown in FIG. 4A during the verification action.

Please refer to FIGS. 4B and 5A. In the discharge period between the time point t0 and the time point t0a, only the discharge enable signal ENdisc is enabled. Consequently, the switch s13 of the verification device 331 is in a close state, and the voltage of the capacitor C11 is discharged to the ground voltage (0V).

Figure 5B:
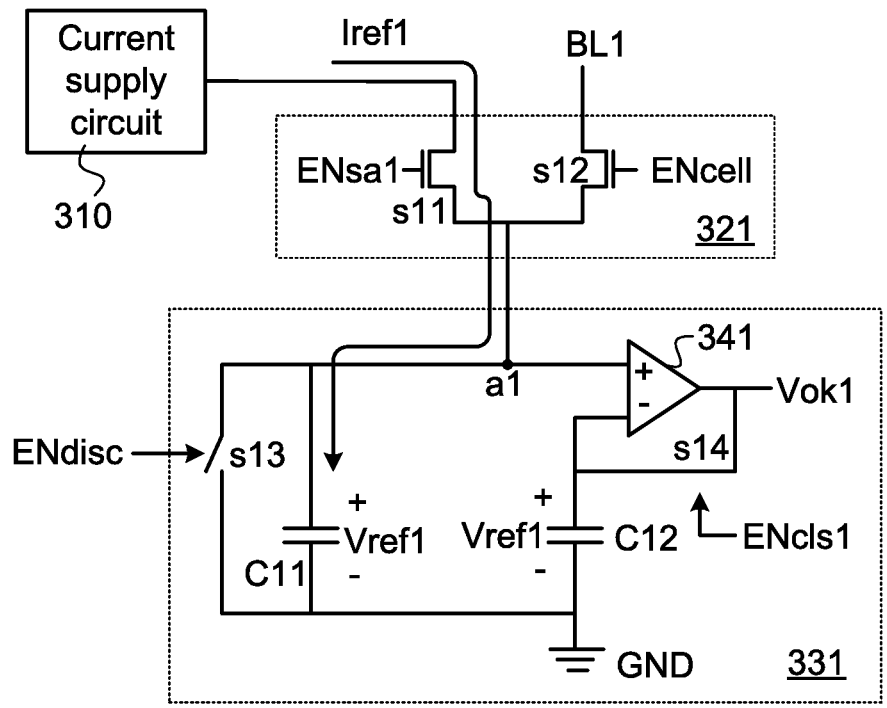
Figure 5C:
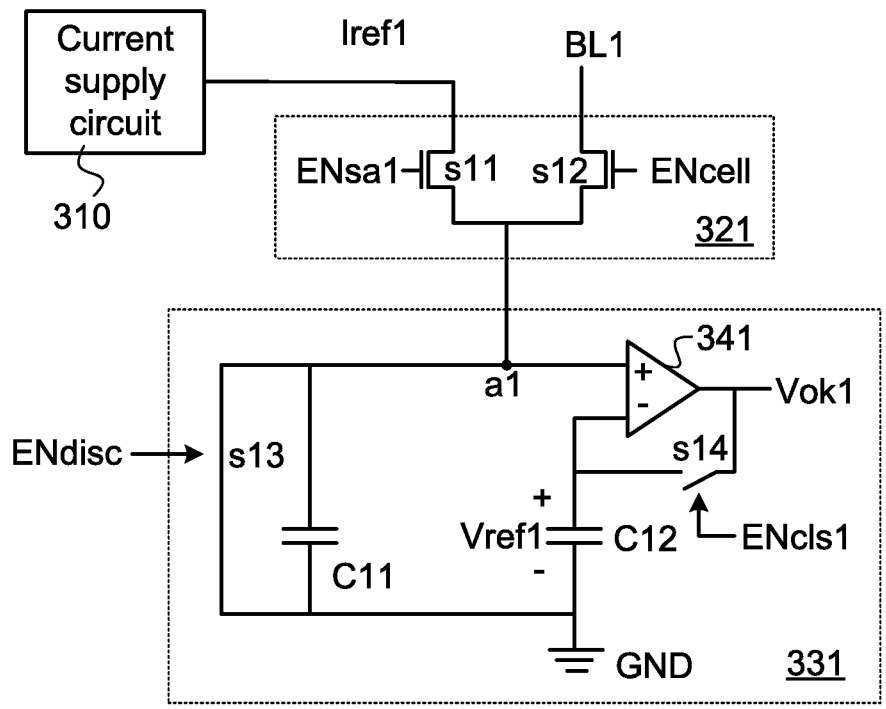

Please refer to FIGS. 4B and 5B. In the sample period Sample_1 between the time point t0a and the time point t1, the reference current enable signal ENsa1 and the close-loop enable signal ENcls1 are activated. Consequently, the reference current path of the path selector 321 is connected between the current supply circuit 310 and the verification device 331, and the switch s14 of the verification device 331 is in the close state. Under this circumstance, the operation amplifier 341 becomes a unit gain buffer. The current supply circuit 310 provides a reference current Iref1 to charge the capacitor C11. In addition, the unit gain buffer duplicates the voltage of the capacitor C11 to the capacitor C12. In other words, at the time point t1, the voltage of the capacitor C11 is charged to a reference voltage Vref1 and the voltage of the capacitor C11 is charged to the reference voltage Vref1.

In the second reference current sampling phase between the time point t1 and the time point t2, the path selector 322 and the verification device 332 are enabled. The operations are similar to those of FIGS. 5A and 5B, and not redundantly described herein. Please refer to FIGS. 4B and 5C. After the time point t1, the switch s13 of the verification device 331 is in the close state according to the discharge enable signal ENdisc. Consequently, the voltage of the capacitor C11 is discharged to the ground voltage (0V). Meanwhile, the reference voltage Vref1 is stored in the capacitor C12 only.

In other words, after the n reference current sampling phases, the corresponding reference voltages are stored in the capacitors C12~Cn2 of the verification devices 331~33n at the time point tn.

As shown in FIG. 4B, the time period between the time point tn and the time point tn+1 is the cell current sampling phase corresponding to the verification action. In the discharge period of the cell current sampling phase, the discharge enable signal ENdisc is activated to assure that the voltages of the C11~Cn1 of the verification devices 331~33n are discharged to the ground voltage (0V). Then, in the verification period Verify of the cell current sampling phase, the cell current enable signal ENcell is activated. Consequently, the bit lines BL1~BLn are connected with the corresponding verification devices 331~33n through the corresponding cell current paths of the path selectors 321~32n. Meanwhile, the memory cells cj1~cjn of the selected memory row generate cell currents to the verification devices 331~33n.

Figure 5D:
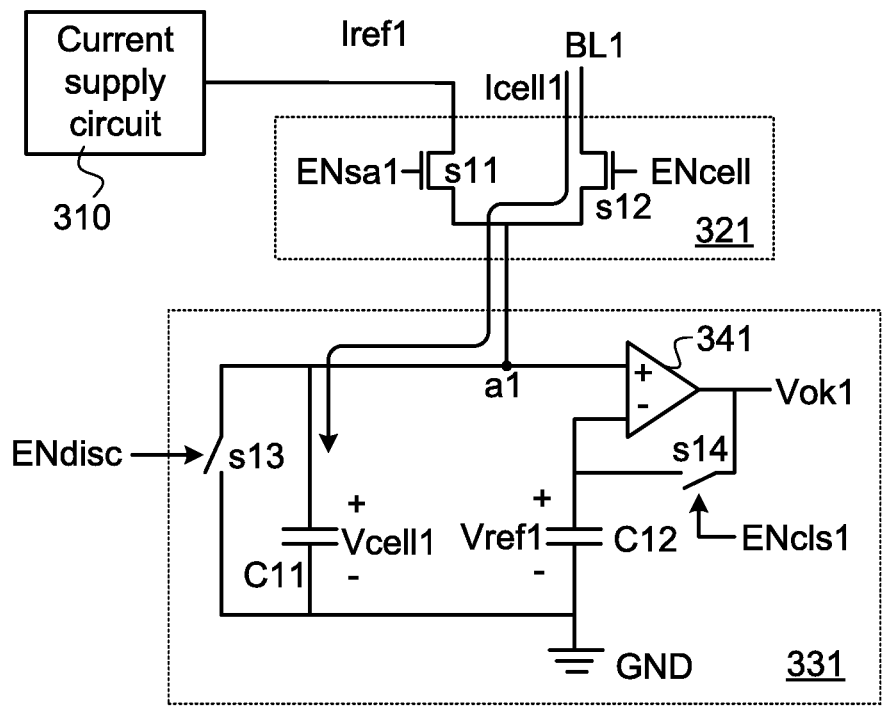

For example, as shown in FIG. 5D, the cell current path of the path selector 321 is connected between the bit line BL1 and the verification device 331. Consequently, the memory cell cj1 of the selected row generates a cell current Icell1 to the verification device 331 to charge the capacitor C11.

At the end of the cell current sampling phase (i.e., the time point tn+1), the operation amplifier 341 may be considered as a comparator for comparing the sensed voltage Vcell1 of the capacitor C11 and the reference voltage Vref1 of the capacitor C12. If the sensed voltage Vcell1 is lower than the reference voltage Vref1, the verification signal Vok1 is in a low level state, indicating that the cell current Icell1 is lower than the reference current Iref1. Under this circumstance, the magnitude of the cell current generated by the memory cell cj1 does not comply with the predetermined storage state. Whereas, if the sensed voltage Vcell1 is higher than the reference voltage Vref1, the verification signal Vok1 is in a high level state, indicating that the cell current Icell1 is higher than the reference current Iref1. Under this circumstance, the magnitude of the cell current generated by the memory cell cj1 complies with the predetermined storage state.

Similarly, the verification signals Vok2~Vokn from the verification devices 332~33n indicate whether the magnitudes of the cell currents generated by the corresponding memory cells cj2~cjn comply with the predetermined storage states.

For example, if the predetermined storage state is the first storage state, the reference current provided by the current supply circuit 310 is 0.1 μA. Consequently, after the verification action is completed, the verification signals Vok1~Vokn can be used to judge whether the corresponding memory cells of the selected row generate the cell current of 0.1 μA.

For example, if the verification signal Vok1 from the verification device 331 is in the low level state, it means that the cell current generated by the memory cell cj1 is lower than 0.1 μA. Meanwhile, the storage state of the memory cell has not reached the first storage state. Whereas, if the verification signal Vok1 from the verification device 331 is in the high level state, it means that the cell current generated by the memory cell cj1 is higher than 0.1 μA. Meanwhile, the storage state of the memory cell has reached the first storage state.

Similarly, if the predetermined storage state is the second storage state, the reference current provided by the current supply circuit 310 is 0.6 μA. Similarly, if the predetermined storage state is the third storage state, the reference current provided by the current supply circuit 310 is 1.1 μA. Similarly, if the predetermined storage state is the fourth storage state, the reference current provided by the current supply circuit 310 is 1.6 μA. After the verification action is completed, the verification signals Vok1~Vokn can be used to judge whether the corresponding memory cells have reached the predetermined storage states.

From the above descriptions, the storage state of the multi-level memory cell reaches the predetermined storage state after the multi-level memory cell has been programmed many times. Moreover, due to the characteristic differences of the n memory cells in the selected row, the memory cells in the selected row cannot reach the predetermined storage states simultaneously. For solving this problem, the present invention provides a program control method for the multi-level memory cell.

Figure 6A:
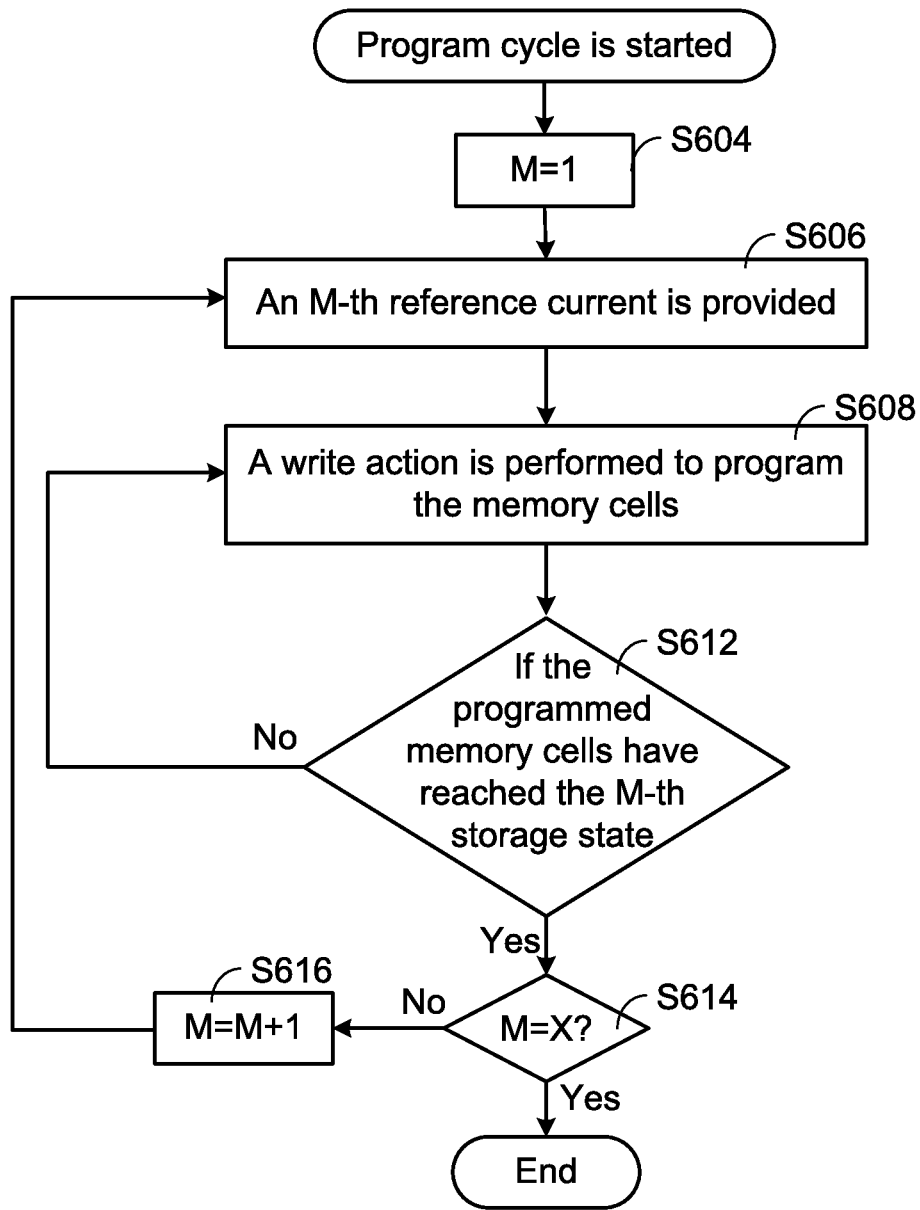
FIG. 6A is a flowchart illustrating a program control method for a multi-level memory cell according to an embodiment of the present invention.
Figure 6B:
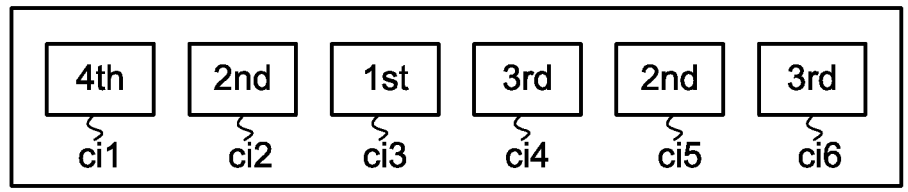
FIG. 6B schematically illustrates the target storage states of the memory cells in the selected row.
Figure 6C:
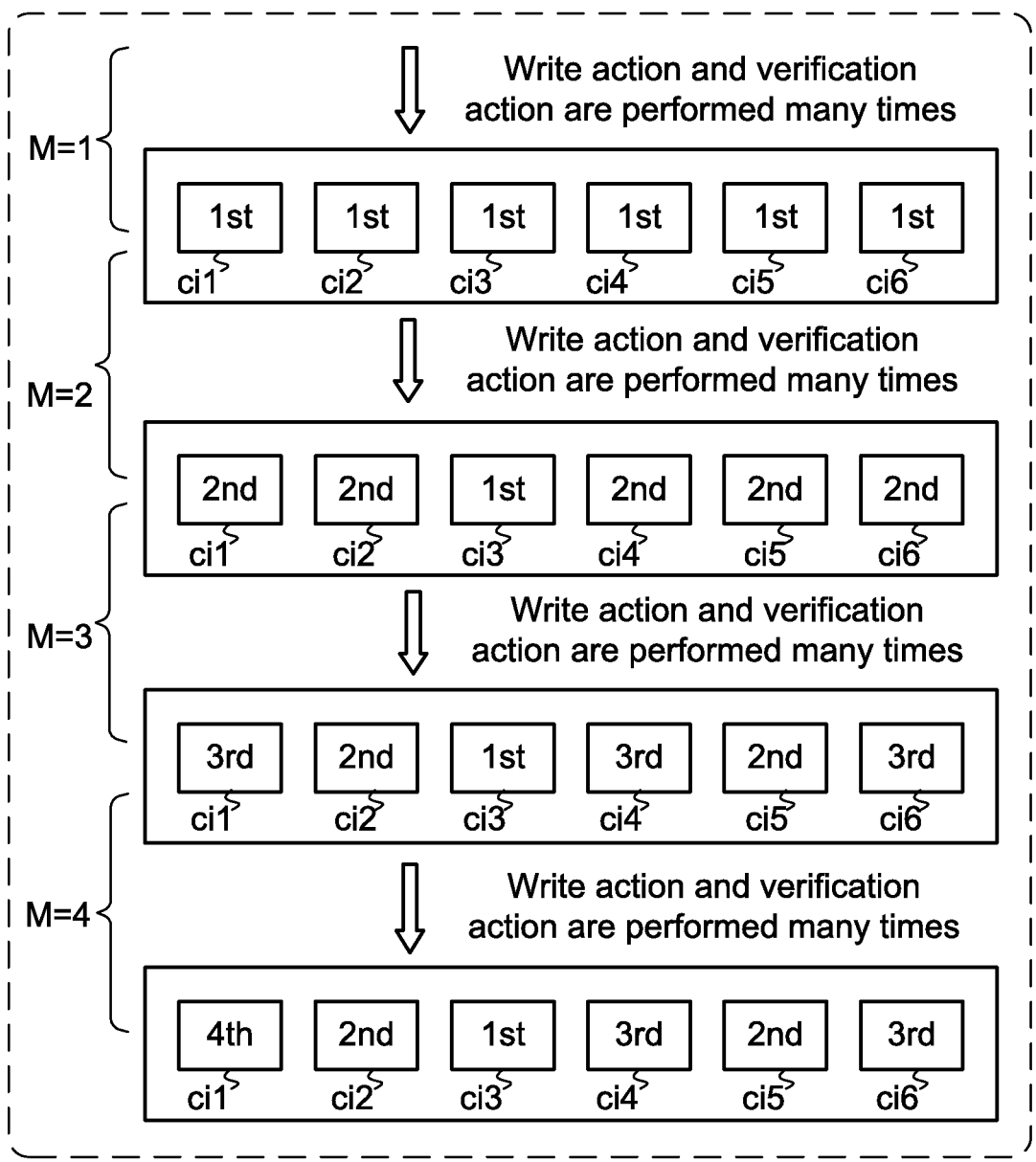
FIG. 6C schematically illustrates the operation of the program control method.

Please refer to FIGS. 6A, 6B and 6C. FIG. 6A is a flowchart illustrating a program control method for a multi-level memory cell according to an embodiment of the present invention. FIG. 6B schematically illustrates the target storage states of the memory cells in the selected row. FIG. 6C schematically illustrates the operation of the program control method. During a program cycle, a selected row of the cell array 300 is determined, and the n memory cells of the selected row are successively programmed to the target storage states.

Please refer to FIG. 6A. After the program cycle is started, M is set as 1 (Step S604) and the current supply circuit 310 provides an M-th reference current (Step S606).

Then, a write action is performed to program the memory cells (Step S608). When the write action is performed, specified memory cells are programmed according to the storage states of the n memory cells in the selected row. For example, if some of the n memory cells in the selected row have reached the target storage states or reached the M-th storage state, these memory cells will undergo the program inhibition action. The memory cells having not reached the M-th storage state will undergo the program action.

Then, a verification action is performed to verify whether the memory cells are in the M-th storage state (Step S612). Particularly, the verification action is performed to judge whether the memory cells programmed in the previous step have reached the M-th storage state. For example, the verification signals Vok1~Vokn from the verification circuit 330 can be used to judge whether the memory cells have reached the M-th storage state. If all of the programmed memory cells have not reached the M-th storage state, the step S608 is repeatedly done and another write action is performed.

When all of the programmed memory cells have reached the M-th storage state, it means that the memory cells in the selected row have reached the M-th storage state or the target storage states. Then, a step S614 is performed to judge whether M is equal to X. If M is not equal to X, M is added by 1 (Step S616) and the step S606 is repeatedly done. Whereas, if M is equal to X, it means that all of the memory cells in the selected row have reached the target storage states. Then, the program cycle is ended. In the above embodiment, M and X are positive integers.

The operations of the program control method will be illustrated with reference to FIGS. 6B and 6C. For example, each of the multi-level memory cells is able to store the 2-bit data. That is, X=4.

As shown in FIG. 6B, the selected row of the cell array comprises six memory cells ci1~ci6. The target storage states of the six memory cells ci1~ci6 are the fourth storage state (4th), the second storage state (2nd), the first storage state (1st), the third storage state (3rd), the second storage state (2nd) and the third storage state (3rd), respectively. That is, during the program cycle, the six memory cells of the selected row need to be programmed to the target storage states.

Please refer to FIG. 6C. After the program cycle is started, M is equal to 1. The current supply circuit 310 provides the first reference current. After the write actions and the verification actions are performed on the memory cells ci1~ci6 of the selected row many times, all of the memory cells ci1~ci6 have reached the first storage state. Since the memory cell cj3 has reached the target storage state, the memory cell cj3 will undergo the program inhibition action in the successive steps.

Due to characteristic differences between the memory cells ci1~ci6, all of the memory cells ci1~ci6 may not reach the first storage state simultaneously. The memory cell having reached the first storage state will undergo the program inhibition action during the next write action. That is, only the memory cells having not reached the first storage state will undergo the program action.

Then, M is equal to 2. The current supply circuit 310 provides the second reference current. After the write actions and the verification actions are performed on the memory cells ci1~ci2 and the memory cells ci4~ci6 of the selected row many times, all of these memory cells have reached the second storage state. Since the memory cells cj2 and ci5 has reached the target storage state, the memory cells cj2 and ci5 will undergo the program inhibition action in the successive steps.

Then, M is equal to 3. The current supply circuit 310 provides the third reference current. After the write actions and the verification actions are performed on the memory cells ci1, ci4 and ci6 of the selected row many times, all of these memory cells have reached the third storage state. Since the memory cells cj4 and ci6 has reached the target storage state, the memory cells cj4 and ci6 will undergo the program inhibition action in the successive steps.

Then, M is equal to 4. The current supply circuit 310 provides the fourth reference current. After the write actions and the verification actions are performed on the memory cell ci1 of the selected row many times, the memory cell ci1 has reached the fourth storage state. Since the memory cells cj4 and ci1 has reached the target storage state, the program cycle of the selected row is ended. Then, the new program cycle of the next selected row of the cell array is started.

As mentioned above, during the program cycle of the multi-level memory cell for storing the 2-bit data, four (i.e., X=4) control procedures are required to confirm whether all memory cells of the selected row have been programmed to the target storage states. Similarly, during the program cycle of the multi-level memory cell for storing the 3-bit data, eight (i.e., X=8) control procedures are required to confirm whether all memory cells of the selected row have been programmed to the target storage states. Similarly, during the program cycle of the multi-level memory cell for storing the 4-bit data, sixteen (i.e., X=16) control procedures are required to confirm whether all memory cells of the selected row have been programmed to the target storage states.

In some embodiments, the non-volatile memory further comprises a voltage clamping circuit for fixing the reference current path and the cell current path at a specified bias voltage. Consequently, the cell current generated by the memory cell is more accurate.

FIGS. 7A and 7B are schematic circuit diagrams illustrating two examples of a path selecting circuit with a voltage clamping circuit.

As shown in FIG. 7A, the path selecting circuit 320a comprises n path selectors 321a~32na and a voltage clamping circuit 313. The structures of the path selectors 321a~32na are identical. Consequently, only the path selector 321a will be described as follows.

The reference current path of the path selector 321a comprises a switching transistor s11 and a control transistor s15. The first source/drain terminal of the control transistor s15 is connected with the current supply circuit 310. The gate terminal of the control transistor s15 receives a clamp voltage Vclamp. The first source/drain terminal of the switching transistor s11 is connected with a second source/drain terminal of the control transistor s15. The second source/drain terminal of the switching transistor s11 is connected with the node a1. The gate terminal of the switching transistor s11 receives the reference current enable signal ENsa1.

The cell current path of the path selector 321a comprises a switching transistor s12 and a control transistor s16. The first source/drain terminal of the control transistor s16 is connected with the bit line BL1. The gate terminal of the control transistor s16 receives the clamp voltage Vclamp. The first source/drain terminal of the switching transistor s12 is connected with the second source/drain terminal of the control transistor s16. The second source/drain terminal of the switching transistor s12 is connected with the node a1. The gate terminal of the switching transistor s12 receives the cell current enable signal ENcell.

The voltage clamping circuit 313 comprises an operation amplifier 315, a switching transistor sc2 and a control transistor sc1. The positive input terminal of the operation amplifier 315 receives a bias voltage Vb. The negative input terminal of the operation amplifier 315 is connected with the first source/drain terminal of the control transistor sc1. The output terminal of the operation amplifier 315 generates the clamp voltage Vclamp. The first source/drain terminal of the control transistor sc1 is also connected with the current supply circuit 310. The gate terminal of the control transistor sc1 is connected with the output terminal of the operation amplifier 315. The first source/drain terminal of the switching transistor sc2 is connected with the second source/drain terminal of the control transistor sc1. The second source/drain terminal of the switching transistor sc2 receives a supply voltage Vss. The gate terminal of the switching transistor sc2 receives a clamp enable signal ENclamp.

When the path selecting circuit 320a is enabled, the clamp enable signal ENclamp is activated. Consequently, the negative input terminal of the operation amplifier 315 of the voltage clamping circuit 313 is fixed at the bias voltage Vb. The difference between the bias voltage Vb and the clamp voltage Vclamp is equal to the magnitude of a threshold voltage Vt of the control transistor sc1. That is, Vb=Vclamp+Vt. Similarly, the gate terminals of the other control transistors s15~sn5 and s16~sn6 of the path selecting circuit 320a receive the clamp voltage Vclamp. Consequently, the first source/drain terminals of the control transistors s15~sn5 and s16~sn6 are fixed at the bias voltage Vb.

As shown in FIG. 7B, the path selecting circuit 320b comprises n path selectors 321b~32nb and a voltage clamping circuit 314. The structures of the path selectors 321b~32nb are identical. Consequently, only the path selector 321b will be described as follows.

The reference current path of the path selector 321b comprises a switching transistor s11 and a control transistor s15. The first source/drain terminal of the switching transistor s11 is connected with the current supply circuit 310. The gate terminal of the switching transistor s11 receives the reference current enable signal ENsa1. The first source/drain terminal of the control transistor s15 is connected with the second source/drain terminal of the switching transistor s11. The second source/drain terminal of the control transistor s15 is connected with the node a1. The gate terminal of the control transistor s15 receives a clamp voltage Vclamp.

The cell current path of the path selector 321b comprises a switching transistor s12 and the control transistor s15. The first source/drain terminal of the switching transistor s12 is connected with the bit line BL1. The second source/drain terminal of the switching transistor s12 is connected with the first source/drain terminal of the control transistor s15. The gate terminal of the switching transistor s12 receives the cell current enable signal ENcell.

The voltage clamping circuit 314 comprises an operation amplifier 316, a switching transistor sc3 and a control transistor sc4. The positive input terminal of the operation amplifier 316 receives a bias voltage Vb. the negative input terminal of the operation amplifier 316 is connected with the first source/drain terminal of the control transistor sc4. The output terminal of the operation amplifier 316 generates the clamp voltage Vclamp. The first source/drain terminal of the switching transistor sc3 is connected with the current supply circuit 310. The gate terminal of the switching transistor sc3 receives a clamp enable signal ENclamp. The first source/drain terminal of the control transistor sc4 is connected with the second source/drain terminal of the switching transistor sc3. The second source/drain terminal of the control transistor sc4 is connected with a supply voltage Vss. The gate terminal of the control transistor sc4 is connected with the output terminal of the operation amplifier 316.

When the path selecting circuit 320b is enabled, the clamp enable signal ENclamp is activated. Consequently, the negative input terminal of the operation amplifier 316 of the voltage clamping circuit 313 is fixed at the bias voltage Vb. The difference between the bias voltage Vb and the clamp voltage Vclamp is equal to the magnitude of a threshold voltage Vt of the control transistor sc4. That is, Vb=Vclamp+Vt. Similarly, the gate terminals of the other control transistors s15~sn5 of the path selecting circuit 320b receive the clamp voltage Vclamp. Consequently, the first source/drain terminals of the control transistors s15~sn5 are fixed at the bias voltage Vb.

From the above descriptions, the present invention provides a non-volatile memory with a multi-level cell array and an associated program control method. During the program cycle, the write action and the verification action are continuously performed many times. After the program cycle, all memory cells of the selected row reach the target storage states and generate the corresponding cell currents.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
a cell array comprising plural multi-level memory cells in an m·n array, wherein the cell array is connected with m word lines and n bit lines, and each of the plural multi-level memory cells is in one of X storage states, wherein X is larger than or equal to 4;
a current supply circuit configured to provide X reference currents;
a path selecting circuit connected with the current supply circuit and the n bit lines, wherein the path selecting circuit comprises n path selectors, and a first path selector of the n path selectors is connected with the current supply circuit and a first bit line of the n bit lines; and
a verification circuit connected with the path selecting circuit, and configured to generate n verification signals, wherein the verification circuit comprises n verification devices, and a first verification device of the n verification devices is connected with the first path selector and is configured to generate a first verification signal,
wherein while a verification action is performed, the non-volatile memory is configured to transmit an M-th reference current from the current supply circuit to the first verification device through the first path selector and the first verification device is configured to convert the M-th reference current into a first reference voltage, and then the non-volatile memory is configured to transmit a first cell current generated by the first multi-level memory cell of the plural multi-level memory cells to the first verification device through the first bit line and the first path selector and the first verification device is configured to convert the first cell current into a first sensed voltage, wherein according to the first reference voltage and the first sensed voltage, the first verification device is configured to generate the first verification signal to indicate whether the first multi-level memory cell has reached an M-th storage state of the X storage states, wherein m, n, M and X are positive integers, M is larger than 1, and M is smaller than or equal to X.

2. The non-volatile memory as claimed in claim 1, wherein the first path selector comprises a reference current path and a cell current path, wherein the reference current path is configured to be controlled according to a reference current enable signal, and the cell current path is configured to be controlled according to a cell current enable signal, wherein when the reference current enable signal is activated, the current supply circuit is connected with the first verification device through the reference current path, wherein when the cell current enable signal is activated, the first bit line is connected with the first verification device through the cell current path.

3. The non-volatile memory as claimed in claim 2, wherein the reference current path comprises a first switching transistor, and the cell current path comprises a second switching transistor, wherein a first source/drain terminal of the first switching transistor is connected with the current supply circuit, a second source/drain terminal of the first switching transistor is connected with the first verification device, a gate terminal of the first switching transistor receives the reference current enable signal, a first source/drain terminal of the second switching transistor is connected with the first bit line, a second source/drain terminal of the second switching transistor is connected with the first verification device, and a gate terminal of the second switching transistor receives the current enable signal.

4. The non-volatile memory as claimed in claim 2, wherein the non-volatile memory further comprises a voltage clamping circuit, and the voltage clamping circuit is connected with the current supply circuit and the path selecting circuit, wherein the voltage clamping circuit is configured to provide a clamp voltage to the path selecting circuit, so that the reference current path and the cell current path of the first path selector are fixed at a bias voltage.

5. The non-volatile memory as claimed in claim 4, wherein the reference current path comprises a first switching transistor and a first control transistor, the cell current path comprises a second switching transistor and a second control transistor, and the voltage clamping circuit comprises an operation amplifier, a third switching transistor and a third control transistor, wherein a first input terminal of the operation amplifier receives the bias voltage, a second input terminal of the operation amplifier is connected with a first source/drain terminal of the third control transistor, an output terminal of the operation amplifier generates the clamp voltage, a first source/drain terminal of the third control transistor is connected with the current supply circuit, a gate terminal of the third control transistor is connected with the output terminal of the operation amplifier, a first source/drain terminal of the third switching transistor is connected with a second source/drain terminal of the third control transistor, a second source/drain terminal of the third switching transistor receives a supply voltage, and a gate terminal of the third switching transistor receives a clamp enable signal, wherein a first source/drain terminal of the first control transistor is connected with the current supply circuit, a gate terminal of the first control transistor is connected with the output terminal of the operation amplifier, a first source/drain terminal of the first switching transistor is connected with a second source/drain terminal of the first control transistor, a second source/drain terminal of the first switching transistor is connected with the first verification device, and a gate terminal of the first switching transistor receives the reference current enable signal, wherein a first source/drain terminal of the second control transistor is connected with the first bit line, a gate terminal of the second control transistor is connected with the output terminal of the operation amplifier, a first source/drain terminal of the second switching transistor is connected with a second source/drain terminal of the second control transistor, a second source/drain terminal of the second switching transistor is connected with the first verification device, and a gate terminal of the second switching transistor receives the cell current enable signal.

6. The non-volatile memory as claimed in claim 4, wherein the reference current path comprises a first switching transistor and a first control transistor, the cell current path of the path selector comprises a second switching transistor and the first control transistor, and the voltage clamping circuit comprises an operation amplifier, a third switching transistor and a second control transistor, wherein a first input terminal of the operation amplifier receives the bias voltage, a second input terminal of the operation amplifier is connected with a first source/drain terminal of the second control transistor, an output terminal of the operation amplifier generates the clamp voltage, a first source/drain terminal of the third switching transistor is connected with the current supply circuit, a gate terminal of the third switching transistor receives a clamp enable signal, a first source/drain terminal of the second control transistor is connected with a second source/drain terminal of the third switching transistor, a second source/drain terminal of the second control transistor is connected with a supply voltage, and a gate terminal of the second control transistor is connected with the output terminal of the operation amplifier, wherein a first source/drain terminal of the first switching transistor is connected with the current supply circuit, a gate terminal of the first switching transistor receives the reference current enable signal, a first source/drain terminal of the first control transistor is connected with a second source/drain terminal of the first switching transistor, a second source/drain terminal of the first control transistor is connected with the first verification device, and a gate terminal of the first control transistor is connected with the output terminal of the operation amplifier, wherein a first source/drain terminal of the second switching transistor is connected with the first bit line, a gate terminal of the second switching transistor receives the cell current enable signal, and a second source/drain terminal of the second switching transistor is connected with the first source/drain terminal of the first control transistor.

7. The non-volatile memory as claimed in claim 2, wherein the first verification device comprises:
   an operation amplifier, wherein a first input terminal of the operation amplifier is connected with the first path selector, and an output terminal of the operation amplifier generates the first verification signal;
   a first switch, wherein a first terminal of the first switch is connected with the first input terminal of the operation amplifier, a second terminal of the first switch is connected with a ground terminal, and a control terminal of the first switch receives a discharge enable signal;
   a second switch, wherein a first terminal of the second switch is connected with the output terminal of the operation amplifier, a second terminal of the second switch is connected with a second input terminal of the operation amplifier, and a control terminal of the second switch receives a close-loop enable signal;
   a first capacitor, wherein a first terminal of the first capacitor is connected with the first input terminal of the operation amplifier, and a second terminal of the first capacitor is connected with the ground terminal; and
   a second capacitor, wherein a first terminal of the second capacitor is connected with the second input terminal of the operation amplifier, and a second terminal of the second capacitor is connected with the ground terminal.

8. The non-volatile memory as claimed in claim 7, wherein during a reference current sampling phase of the verification action, the first capacitor is charged to the first reference voltage by the M-th reference current and the close-loop enable signal is activated, so that the first reference voltage is duplicated to the second capacitor by the operation amplifier, wherein during a cell current sampling phase of the verification action, the first capacitor is charged to the first sensed voltage by the first cell current, wherein according to the first reference voltage and the first sensed voltage, the operation amplifier generates the first verification signal.

9. The non-volatile memory as claimed in claim 8, wherein in a discharge period of the reference current sampling phase and a discharge period of the cell current sampling phase, the discharge enable signal is enabled, so that the first capacitor is discharged to a ground voltage.

10. A program control method for the non-volatile memory according to claim 1, the program control method comprising steps of:
   determining a selected row of the cell array, and starting a program cycle of the selected row;
   setting M as 1;
   (a) the current supply circuit providing the M-th reference current;
   (b) performing a write action to program the memory cells which have not reached the M-th storage state;
   (c) performing the verification action to judge whether the programmed memory cells have reached the M-th storage state;
   if the programmed memory cells have not reached the M-th storage state, performing the step (b) again;
   if the programmed memory cells have reached the M-th storage state, judging whether M is equal to X;
   if M is not equal to X, adding 1 to M, and performing the step (a) again; and
   if M is equal to X, ending the program cycle.

11. The program control method as claimed in claim 10, wherein the verification action contains n reference current sampling phases and a cell current sampling phase, wherein during the reference current sampling phases, the n verification devices receive the M-th reference current sequentially and correspondingly generate n reference voltages, wherein during the cell current sampling phase, the n memory cells of the selected row generate n cell currents to the n verification devices, so that the n verification devices generate n sensed voltages, wherein the n verification devices generate the n verification signals according to the n reference voltages and the n sensed voltages.

12. The program control method as claimed in claim 10, wherein the non-volatile memory judges whether the programmed memory cells have reached the M-th storage state according to the n verification signals generated by the verification circuit.

13. The program control method as claimed in claim 10, wherein the step (b) comprises sub-steps of:
   dividing the n memory cells of the selected row into first-portion memory cells and second-portion memory cells, wherein the first-portion memory cells have reached the target storage states or the M-th storage state, and the second-portion memory cells have not reached the M-th storage state;
   allowing the first-portion memory cells to undergo a program inhibition action; and
   allowing the second-portion memory cells to undergo a program action.

* * * * *